United States Patent [19]

Kameya

[11] Patent Number: 4,570,135
[45] Date of Patent: Feb. 11, 1986

[54] DELAY LINE

[75] Inventor: Kazuo Kameya, Saitama, Japan

[73] Assignee: Elmec Corporation, Japan

[21] Appl. No.: 467,635

[22] Filed: Feb. 18, 1983

[30] Foreign Application Priority Data

Feb. 22, 1982 [JP] Japan .................................. 57-27135
Feb. 22, 1982 [JP] Japan .................................. 57-27136

[51] Int. Cl.⁴ ............................................... H03H 7/32
[52] U.S. Cl. .................................... 333/138; 333/139; 333/140; 336/225
[58] Field of Search ............................... 333/138–140, 333/156, 161, 162, 245, 23; 336/69, 149, 150, 229, 223, 225; 29/600, 602 R

[56] References Cited

U.S. PATENT DOCUMENTS

| | | | |
|---|---|---|---|
| 2,619,537 | 11/1952 | Kihn | 336/149 X |
| 2,943,277 | 6/1960 | Lewis | 333/162 |
| 3,585,534 | 6/1971 | Senf | 333/161 |
| 3,585,535 | 6/1971 | Senf | 333/161 |
| 3,602,846 | 8/1971 | Hauser | 333/138 X |
| 3,864,648 | 2/1975 | McVickers | 333/156 X |

Primary Examiner—Marvin L. Nussbaum
Attorney, Agent, or Firm—Sughrue, Mion, Zinn, Macpeak, and Seas

[57] ABSTRACT

An ultra-high speed lumped constant delay line includes an inductance element formed by winding a conductor into a single layer solenoid shape of predescribed pitch P, and a plurality of capacitors connected between ground and the conductor at every turn of the inductance element. The pitch P and the winding diameter T in the direction of short diameter are set according to the relation $0.2 < P/T < 1.9$.

12 Claims, 19 Drawing Figures

DELAY LINE

BACKGROUND OF THE INVENTION

1. Field of the Invention

This invention relates to a lumped constant delay line comprising an inductance element and capacitors connected together, and more particularly relates to a subminiature ultrahigh speed delay line having a fast rise time and suitable for digital circuits of computers, etc.

2. Description of the Prior Art

Until now, delay lines formed by cutting a coaxial cable to a suitable length to obtain a desired delay time, and microstrip lines which can be considered as distributed constant lines, etc., as shown in, for example, U.S. Pat. Nos. 3,585,534 and 3,585,535, have been proposed as delay lines having fast rise times, for example 1 nS or less.

However, in the former case the size of the line is large and terminal processing is troublesome, and in the latter case the size is large, the cost is high and the characteristics are undesirable.

On the other hand, a lumped constant delay line formed by connecting capacitors and a plurality of inductors wound on a bobbin has been employed. However, with such a lumped constant delay line it is difficult to achieve optimum coupling between the inductors at high frequencies, for example at frequencies above 1 GHz, and hence it was considered difficult to achieve a rise time of less than 1 nS.

Accordingly, the conventional lumped constant delay line had the disadvantage that a rise time of less than 1 nS could not be achieved because the delay characteristic degraded at high frequencies. Under these circumstances, the coaxial cable, etc. having the above-mentioned defects had to be used for delay lines of less than 1 nS rise time.

SUMMARY OF THE INVENTION

This invention is made to solve the above-mentioned defects.

The main object of this invention is to provide a lumped constant ultra-high speed delay line whose rise time at high frequencies is fast, and in which it is possible to easily select optimum coupling between the inductors.

Another object of this invention is to provide a subminiature delay line.

Still another object of this invention is to provide a delay line which can be easily manufactured.

A further object of this invention is to provide a delay line which enables easy construction of a variable delay line in which the delay time can be changed.

In order to achieve these objects, this invention employs an inductance element comprising a plurality of inductors formed by winding a conductor into a single layer solenoid coil of prescribed pitch P and having a space between every turn such that each turn forms an inductor, and a plurality of capacitors connected between ground and said conductor at every turn of this inductance element. One important feature of the invention resides in setting the pitch P of the inductance element and the winding diameter T of the shorter diameter direction of the winding such that $0.2 < P/T < 1.9$.

According to the present invention which is comprised as described above, a very miniaturized lumped constant delay line can be achieved which enables easy optimum coupling between the inductors and permits a fast rise time and use at ultra-high frequencies.

BRIEF DESCRIPTION OF THE DRAWINGS

FIG. 11.A and FIG. 11.B represent cross sectional side views showing another embodiment of the bobbin used in the delay line of the present invention;

FIG. 12A and FIG. 12.B represent a plane view and a cross sectional side view showing still another embodiment of the bobbin used in the delay line of the present invention;

DETAILED DESCRIPTION OF THE PREFERRED EMBODIMENTS

Before describing embodiments of the present invention, the principle of operation of the delay line of the present invention will first be considered, referring to FIG. 1 to FIG. 6.

Figure 1:
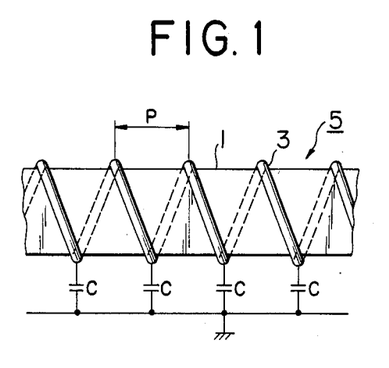
FIG. 1 represents a simplified front view for explaining the principle of the delay line according to the present invention.
Figure 2:
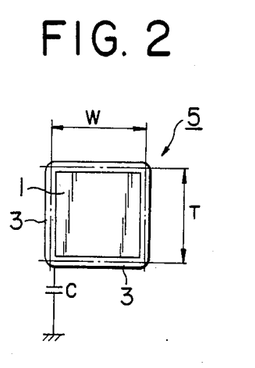
FIG. 2 shows a simplified side view of FIG. 1.

FIG. 1 and FIG. 2 show the configuration of inductance element 5 which is formed by winding a wire (conductor) 3 in a space between adjacent turns on a rod shaped bobbin 1 of non-magnetic material of a rectangular cross section having thickness T and width W. Precisely speaking, the thickness T and width W are the distances between the centers of the wire on the opposite sides, in the directions of thickness and width respectively, of the bobbin 1.

Figure 3:
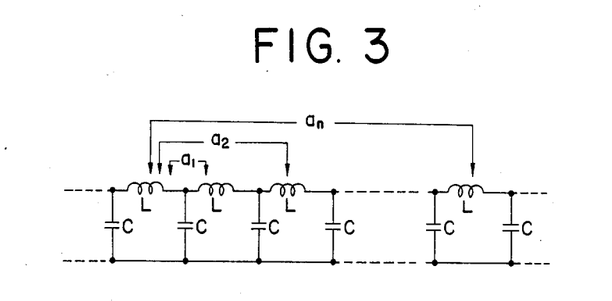
FIG. 3 represents the network of the delay line shown in FIG. 1.

At each turn, a capacitor C is connected between the wire 3 and ground. The inductance L of one turn serves as one section of the delay line and each inductance L is coupled through mutual inductance to other inductances L as shown in the network shown in FIG. 3.

considering only the inductance L of the lefthand-end, FIG. 3 shows its coupling with the inductances L to the right thereof. However, naturally there are inductances L on the left side of the above mentioned left-end inductance L also, and these are also coupled through mutual inductance in the same manner; and other inductances L are also similarly coupled to the inductances on their left and right sides.

Each inductance L is coupled to its adjacent inductance L by a coupling coefficient $a_1$, to the next inductance 1 by a coupling coefficient $a_2$ ... and to the nth inductance by a coupling coefficient $a_n$.

The delay line formed in this manner will be described hereinafter. the coupling coefficients $a_1$, $a_2$, ..., $a_n$ are first to be determined.

Figure 4:
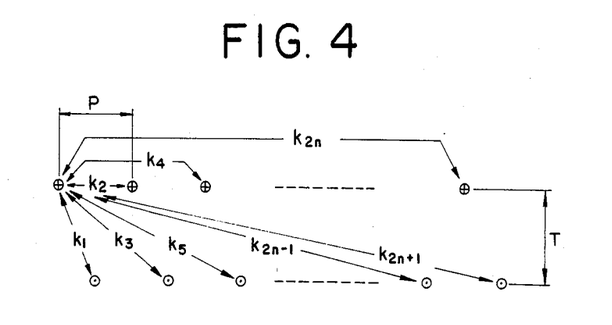
FIG. 4 is a diagram showing the coupling states in the delay line shown in FIG. 1.

Taking an arbitrary wire on the upper side of bobbin 1 in FIG. 1, that is, an arbitrary wire 3 in the direction of the width W as the reference; let the coupling coefficients between this reference wire and the other wires on the upper side of the bobbin 1 be $k_2$, $k_4$, ... $k_{2n}$ in that order as shown in FIG. 4, and let the coupling coefficients between this reference wire and other wires in the direction of the width on the lower side of the bobbin 1 be $k_1$, $k_3$, ..., $k_{2n-1}$, $k_{2n+1}$.

Considering the current flowing in the reference wire, the currents in the wire 3 on the upper side of the bobbin 1 flow in the same direction as in the reference wire and hence the coupling coefficients $k_2$, $k_4$, ..., $k_{2n}$ represent positive coupling. However, since the currents flowing in the wire 3 on the lower side of the bobbin 1 are in the opposite direction, the coupling coefficients $k_1$, $k_3$, ..., $k_{2n-1}$, $k_{2n+1}$ represent negative coupling. As a result, the absolute value of the coupling coefficient decreases as the distance between the wires increases.

To simplify the present invention, if we make the width W of the bobbin 1 shown in FIG. 2 equal to its thickness T, the coupling coefficients $a_1$, $a_2$, ..., $a_n$ between the inductances L of the delay line shown in FIG. 3 can be represented by the following equations.

$$a_1 = \frac{2k_2 - k_1 - k_3}{2(1 - k_1)} \quad (1)$$

$$a_2 = \frac{2k_4 - k_3 - k_5}{2(1 - k_1)} \quad (2)$$

$$a_n = \frac{2k_{2n} - k_{2n-1} - k_{2n+1}}{2(1 - k_1)} \quad (3)$$

The delay characteristic of the delay line is determined mainly by these coupling coefficients $a_1$, $a_2$, ... $a_n$. Since the effect of $a_1$ is particularly large and the effects of the other coefficients $a_2$, $a_3$, ... $a_n$ decrease in that order, the coupling coefficient $a_1$, will be initially discussed.

Assuming that the sign of the coupling coefficient $a_1$ is positive and that no coupling coefficients exist after $a_2$, the optimum valve of coefficient $a_1$ is found to be $a_1 = 0.142$ (corresponding to m=1.34 of the derived m-type) from conventional theoretical calculations. However, in actual practice it is necessary to take the existence of coupling coefficients after $a_2$ and the effect of stray capacitance into consideration, and accordingly it is considered suitable to select $a_1$ in the range of $a_1 = 0.1$ to 0.2.

On the other hand, if the three wires which give rise to the coupling coefficients $k_1$ and $k_2$ in FIG. 4 are positioned at mutually equidistant positions (at each vertex of an equilateral triangle), $k_1 = k_2$. Therefore, under this condition, the above equation (1) becomes, $$a_1 = \frac{k_2 - k_3}{2(1 - k_1)} \quad (4)$$

Also, the relation between the coupling coefficients $k_2$ and $k_3$ is $k_2 > k_3$ as is evident from FIG. 4, so under this condition the coupling coefficient $a_1$ is bound to be greater than zero ($a_1 > 0$). Therefore, if the relation between the pitch P and dimension T in the direction of thickness in FIG. 4 is $T = (\sqrt{3}/2)P$, that is, $P/T = 1.155$, then $a_1 < 0$). Conversely, if P/T decreases below 1.155, $a_1$ increases monotonically. In this manner, $a_1$ changes by changing P/T.

Next the coupling coefficient $a_2$ will be described hereinafter.

Theoretically, the suitable sign of $a_2$ is negative and its suitable absolute value is considered to be about 0.02 to 0.03. Accordingly, the relationship among the coupling coefficients $k_3$, $k_4$ and $k_5$ from the spacing between the wires shown in FIG. 4 becomes $k_3 > k_4 > k_5$ and it becomes clear that these absolute values are quite close. As a result, the value of the numerator in the above equation (2) becomes quite small and the coupling coefficient $a_2$ also becomes very small. On the other hand, if the pitch P shown in FIG. 4 decreases, $a_2$ positively increases.

From the above equation (3) and FIG. 4, $$k_{2n-1} \simeq k_{2n} \simeq k_{2n+1},$$

so the values of coefficients $a_3$, ..., $a_n$ become negligibly small.

In this manner, a change in the ratio P/T of the pitch P and the thickness (winding diameter) T of the inductance element 5 changes the values of coupling coefficients $a_1$ and $a_2$.

Figure 5:
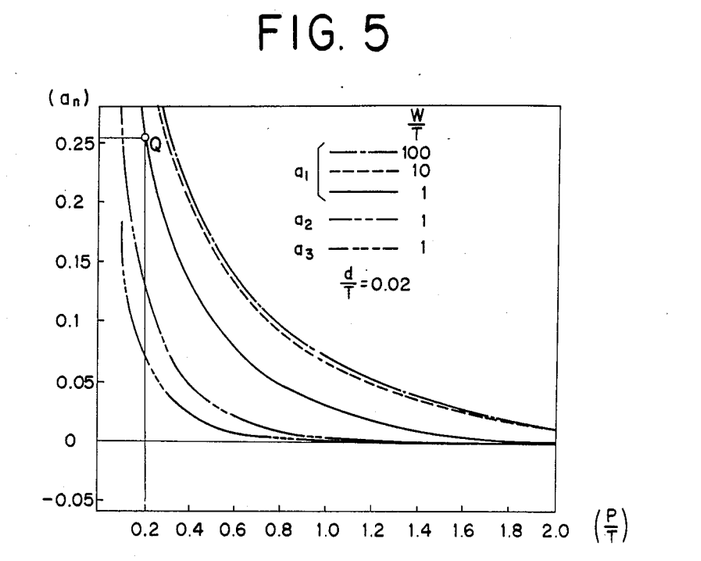
FIG. 5 and FIG. 6 are curves showing the variation of the coupling coefficient in the delay line shown in FIG. 1.
Figure 6:
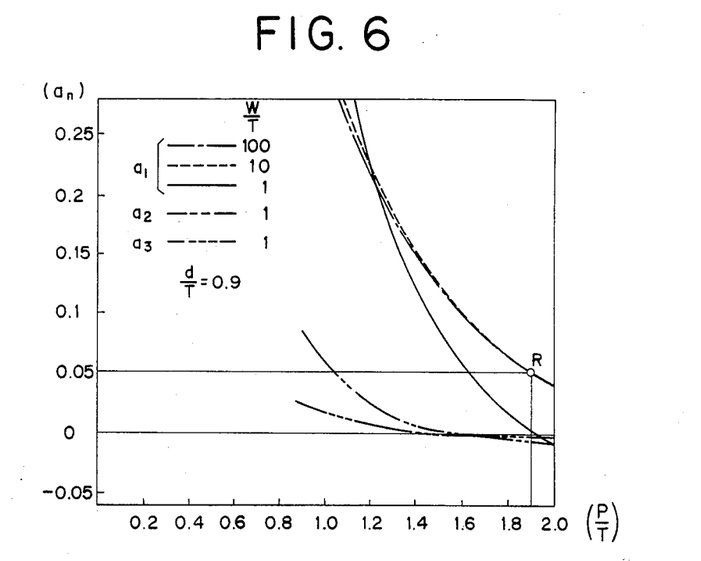

FIG. 5 and FIG. 6 represent characteristic curves which are drawn by using equations derived from the electromagnetic theory and which show the relation between the value of $a_n$ and P/T taking the ratio W/T of the width W and thickness T of bobbin 1 as the parameter—taking W/T for $a_1$ as 1, 10 and 100 and taking W/T for $a_2$ and $a_3$ as 1. Considering the diameter of the wire as d, FIG. 5 shows the case when the ratio of the wire diameter d and thickness T is taken as d/T=0.02 (a comparatively smaller value in practice) and FIG. 6 shows the case when d/T=0.9 (the maximum value in practice).

From these graphs, which show W/T and d/T in a wide practical range, that is, W/T ranging from 1 (cross section of bobbin 1 is a square) to 100 (bobbin 1 is a very thin strip) and d/T ranging from 0.02 (a comparatively finer wire diameter d is selected) to 0.9 (a very thick wire is selected), optimum value of the coupling coefficient $a_1$ can be easily determined by suitably selecting the ratio of the pitch P and thickness T of the inductance element. In this manner, the coupling coefficient $a_2$ can be reduced to a suitably small positive value which almost does not affect the delay characteristic so that coupling coefficients beyond $a_3$ can be neglected and a characteristic very close to that of a derived m-type delay line with only the coupling coefficient $a_1$ can be achieved.

With regard to making a more practical delay line, it can be noted that the delay characteristic is affected by such factors as the distributed capacitance between the inductances and by the inductance of the wires of the capacitor connected to the inductance, and so on. So, to make a delay line having a flat delay characteristic, it is better to select the coupling coefficient $a_1$ in the range 0.1 to 0.2. However, since the delay line is not only required to have a flat characteristic but in some cases an inclination is needed in the delay characteristic for the purpose of phase compensating an external circuit by means of the delay line, it is desirable to have the coupling coefficient $a_1$ in the range 0.05 to 0.25.

If these conditions are imposed on FIG. 5 and FIG. 6, then in order to keep the value of the coupling coefficient $a_1$ in the range of 0.05 to 0.25 even for a large range of values of W/T and d/T, an inductance element possessing the desired value of coupling coefficient $a_1$ can be easily constructed by selecting P/T in the range of 0.2 (point Q in FIG. 5) to 1.9 (point R in FIG. 6) according to the diameter of the wire 3.

Considering these relationships, it was found that a delay line possessing an optimum coupling coefficient could be obtained by selecting the pitch P and thickness T of the inductance element so that, $$0.2 < P/T < 1.9 \tag{5}$$

Based on the theoretical investigations carried out in the foregoing, detailed embodiments of the delay lines of the present invention will be described below.

Figure 7:
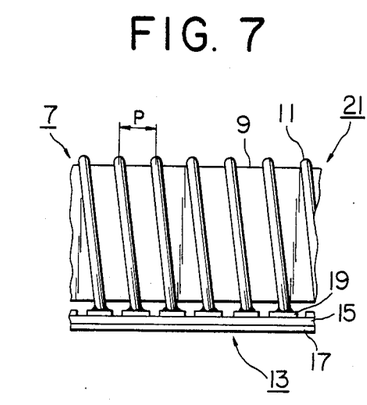
FIG. 7 represents a partial front view of one embodiment of the delay line of the present invention.
Figure 8:
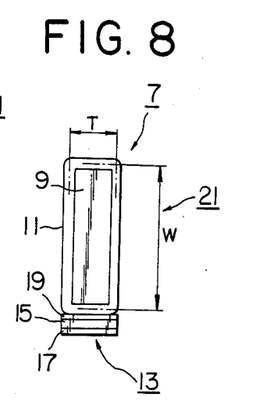
FIG. 8 shows a side view of the delay line shown in FIG. 7.

FIGS. 7 and 8 show that an inductance element 7 which is formed by winding, according to the above equation (5), a silver-plated wire 11 in the form of a single layer solenoid with pitch P, width W and thickness T around a nonmagnetic bobbin 9 of rod shape of rectangular cross section of slightly smaller width W and thickness T as described later. That is, the pitch P and thickness T are selected in the range of $0.2 < P/T < 1.9$ according to the diameter, etc. of the wire 11.

At each turn of the inductance element 7, a capacitor 13 is connected between the wire 11 and ground. This capacitor 13 comprises a plurality of capacitors consisting of a dielectric plate 15 extending along the length of the bobbin 9 at the lower side of the bobbin, ground electrode 17 formed on the bottom of this dielectric plate 15, and plural capacitance electrodes 19 formed on the top of the dielectric plate 15 with the same pitch P as that of the wire 11 of the inductance element 7. A lumped contact delay line 21 is thus formed by connecting the wire 11 at the bottom smaller side T of the inductance element 7 to the capacitance electrode 19 by the solder reflow method, etc.

Since in a delay line 21 constructed in this manner the major portion of the wire 11 of the inductance element 7 is separated from the ground electrode 17 of the capacitor 13, the eddy-current loss of the inductance element 7 is small and it is easy to arrange plural inductance elements 7 in parallel. This type of delay line 21 is thus suitable for high density mounting.

By constructing the delay line 21 as shown in FIGS. 7 and 8 according to the present invention, that is, by connecting a capacitor 13 having 40 capacitor electrodes 19, each having a capacitance of 0.5 PF, to the inductance element 7 formed by winding 40 turns of a silver-plated wire T and 0.4 mm pitch P, a delay line characteristic of characteristic impedance 100 ohms, delay time 2 nS, rise time 150 ps and −3 dB pass band width 2.3 GHz was achieved. Moreover, a large ratio (about 13.3) of delay time to rise time can be achieved at a fast rise time.

In this manner, the delay line 21 of the present invention makes it possible to use the inductance element 7 with optimum coupling conditions, so that a good characteristic can be achieved at high frequencies, which could not be achieved with conventional lumped constant delay lines.

Moreover, in the delay line 21 of the present invention, the coupling coefficients which determine the delay characteristic are not the absolute values of the dimensions which constitute the delay line, but are instead the ratios of the dimensions; and at the same time the relation between the dimensions which constitute the delay line and the various characteristics of the delay line can be explicitly obtained. That is, if all the various dimensions of the delay line are reduced by 1/S (capacitor 13 should also be of 1/S value), the characteristic impedance of the delay line does not change, the delay time and rise time become 1/S (S times for −3 dB pass band), mounting area becomes $1/S^2$ and volume becomes $1/S^3$.

This means that the delay line 21 of the present invention can be miniaturized and at the same time ultra-high speed and high density can be rapidly realised.

Furthermore the inductor element according to the present invention is of the self-supporting type because each turn of the inductance element 7 is fixed by soldering. So if an air-core solenoid construction is used by removing the nonmagnetic bobbin 9 from the delay line 21, the dielectric loss occuring in the bobbin at ultrahigh frequencies can be further reduced.

Figure 9:
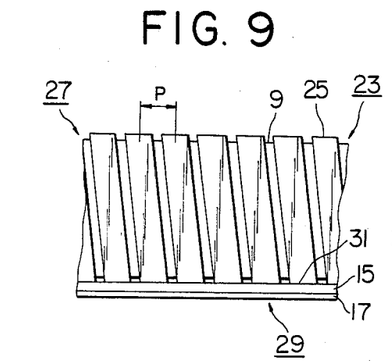
FIG. 9 and FIG. 10 represent a partial front view and a side view showing another embodiment of the present invention.
Figure 10:
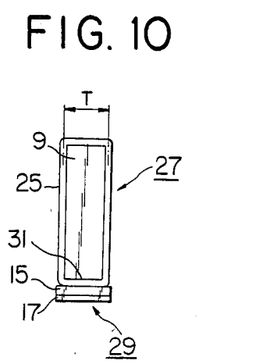

FIGS. 9 and 10 show a further embodiment of the present invention.

In this delay line 23, the inductance element 27 is formed by winding a conductor strip 25 in the form of a single layer solenoid of pitch P on a nonmagnetic bobbin 9 of a rectangular cross section as described before; the conductor strip 25 on the thickness T side of the inductance element 27 is combined as the capacitor electrodes 31 of the capacitor 29 and at the same time it is placed opposite to the ground electrode 17, holding the dielectric plate 15 in between, to form the capacitor 29.

In this construction also, if the thickness T and pitch P are selected within the range $0.2 < P/T < 1.9$, a good delay characteristic can be obtained and at the same time the capacitor 29 can be easily formed by forming the dielectric plate and electrode on the inductance element 27 by means of a high speed sputtering technique, etc.

Figure 11A:
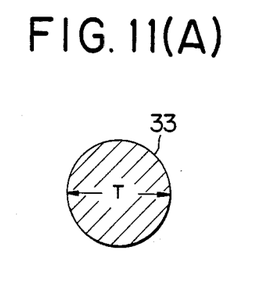
Figure 11B:
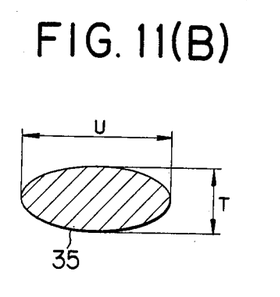

Moreover, in the present invention it is not always necessary to use a bobbin 9 of rectangular cross section. For example, bobbins 33 and 35 of circular or elliptical cross section as shown in FIGS. 11A and 11B can also be used. When using these bobbins 33 and 35, the inductance element should be made according to the relationship $0.2 < P/T < 1.9$ where T is the diameter of the circle or the minor axis of the ellipse. The diameter of the circle should be considered as the "short" diameter T.

Figure 12A:
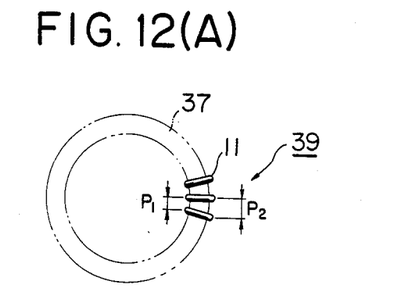
Figure 12B:
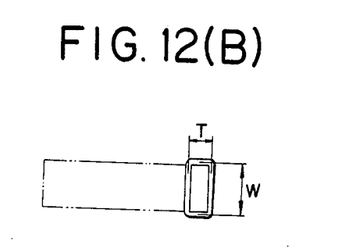

FIGS. 12A and 12B show another embodiment of the present invention. The delay line shown in these drawings comprises a toroidal bobbin used as a nonmagnetic ceramic bobbin 37 instead of the rod shaped bobbin 9 shown in FIG. 7 and an inductance element 39 formed by space winding wire 11 (3 turns are shown in the figure) as a single layer solenoid on the nonmagnetic bobbin 37 of toroidal shape (Capacitor 29 has been deleted from the drawing). In the delay line of this type, the pitch $P_1$ at the inside of the bobbin 37 is different from the pitch $P_2$ at the outside of the bobbin, and naturally $P_1 < P_2$. However, in this case the above equation (5) should be applied by taking as the pitch P the average of $P_1$ and $P_2$, that is, $P = (P_1 + P_2)/2$.

In the delay line of such construction, it is also possible to make the inductance element 39 in the form of a loop of frame shape, etc., but if the bobbin 37 of toroidal shape is used in particular, an array of fixed contacts of arc shape can be formed on the wound wire 11 and a movable contact (not shown), with the center of the bobbin 37 as the fulcrum, can be very easily slid on the fixed contact array, and thus a miniaturized and easy to operate variable delay line can be realized.

Moreover, an ultra-high speed variable delay line can be obtained by forming an array of fixed contacts on a conductor strip on the nonmagnetic bobbin, and sliding a movable contact thereon.

Moreover, it is also possible to form the inductance element as a single layer solenoid by forming a conductor layer on the surface of a nonmagnetic bobbin made of alumina ceramics, etc. by means of plating, etc., then precisely grinding the bobbin surface by mechanical means, by using photoetching technique or laser beam cutting technique or some other conventional technique, to form a conductive inductor coil.

Still another embodiment of the delay line of the present invention will be described hereinafter. The inductance element for the delay line of the present invention will be discussed first.

Figure 13:
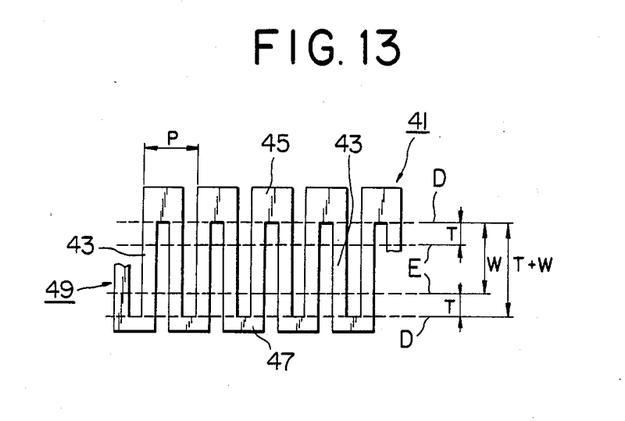
FIG. 13 and FIG. 14 represent an developed plane view and a perspective view showing another embodiment of the inductance element used in the delay line of the present invention.
Figure 14:
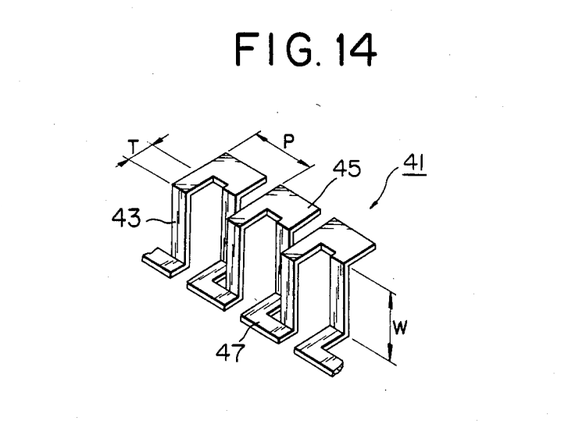

The inductance element 41 shown in FIG. 13 is composed of plural conductor strips 49 connected integrally in series and paralleled with a prescribed pitch P with a prescribed spacing through folded-back connecting portions 45, 47 in the same plane and, as shown in FIG. 14, is formed by bending the conductor strips 43 to form a 3-dimensional structure.

That is, in transforming the planar construction of FIG. 13 into the 3-dimensional structure of FIG. 14, the legs 49 are alternatingly bent along lines D and E, respectively, as will be apparent from a comparison of FIGS. 13 and 14, to form the inductance element 41 of solenoid shape of pitch P as shown in FIG. 14.

This inductance element 41 possesses a hollow cross section of rectangular shape with long side W and short side T and is so constructed that the folded-back connecting portions 45 and 47 can be extended in parallel and in opposite directions from the opposite short side T. The pitch P and the short side T of the inductance element are set within the range of $0.2 < P/T < 1.9$.

By forming the conductor strips 49 shown in FIG. 13 from a conductor plate by means of photoetching or some other technique, a number of inductance elements can be made at the same time with precise dimensions. Moreover, this is also possible using the technique of punching, etc. In the inductance element 41, it is possible to insert a bobbin into the air core space of hollow cross section described above. However, at ultra-high frequencies (for example, 1 GHz or more), the bobbin materials are limited, so at such high frequencies it is suitable to construct an air core solenoid of low loss and low dielectric constant.

Figures 15, 16:
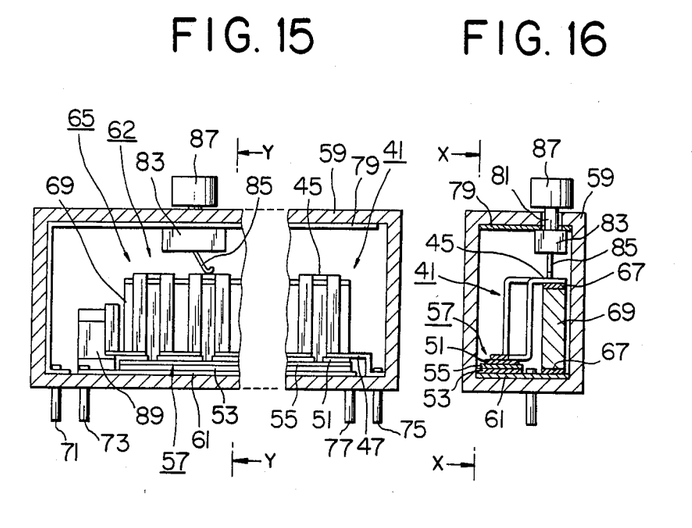
FIG. 15 and FIG. 16 represent a plane view (partly shown in cross section) and a cross sectional view showing still another embodiment of the delay line of the present invention.

FIGS. 15 and 16 represent a front view (partially cross sectional) and a cross sectional view along line Y—Y showing the delay line formed using the air core inductance element 41 shown in FIG. 14. A variable delay line is shown as an example. FIG. 15 shows the cross sectional view of FIG. 16 along line X—X.

In FIGS. 15 and 16, each of the folded-back connecting portions on one side (the lower side in the drawing) is soldered by the solder reflow method to each of the capacitor electrodes 51 of the capacitor 57 formed by the dielectric plate 55 between the capacitor electrodes 51 and 53. The other electrode 53 of the capacitor 57 is connected between each turn of the inductance element 41 and ground and in this manner a lumped constant type delay line 62 is formed.

The other (upper side in the drawing) folded-back connecting portion 45 of the inductance element 41 also serves as a fixed contact 63 (see FIG. 17) and a fixed contact array 65 extending along the length of the delay line is made up of these fixed contacts 63. This fixed contact array 65 is attached by an adhesive sheet 67 by thermal bonding to the top of a support 69 having an elongated shape of rectangular cross section which is thermally bonded to the ground plate 61 of the housing 59 by another adhesive sheet 67. Its position is determined by arranging the portions 45 on the top of the support 69 in a flat plane. The support 69 is made of an insulating material such as alumina ceramics, etc. The inductance element 41 is fixed inside the housing 59 by means of the capacitor 57 and the support 69.

The housing 59 is of thin and long shape. The delay line 62 is contained inside this housing 59 as described above; the input terminal 71, input ground terminal 73, output terminal 75 and output ground terminal 77 are directly installed at its bottom; and the electrode 79 is connected to the input terminal 71 through the inner side (of the housing 59). A slide slot 81 corresponding to the above-mentioned fixed contact array 65 is provided at the inner top of the housing 59.

Inside the housing 59, conductive slide body 83 is arranged so as to slide in contact with the electrode 79 and at the same time protrudes from the top of the housing 59 through the slide slot 81. From the bottom of this slide body 83, a slider 85 is set protruding and facing toward the fixed contact array 65 to elastically contact the same. That is, the slide body 83 is kept in contact with the electrode 79 by the elastic force of the slider 85. An insulating knob 87 is attached to the top of the slider body 83 protruding from the slide slot 81. Therefore, the input terminal 71 may be connected to one of the fixed contacts of array 63 through the electrode 79, slide body 83 and the slider 85. By sliding the slide body 83 by means of the knob 87, it comes in contact one by one with the fixed contacts 63 and thus the selected fixed contact 63 is connected to the input terminal 71.

Each of the ground terminals 73 and 77 is connected to the ground electrode 61 inside the body 59 and one end (the right end in FIG. 15) of the inductance element 41 is connected to the output terminal 75 and the other end (the left end in the drawing) is connected to the ground electrode 61 through the internal terminal resistor 89.

Figure 17:
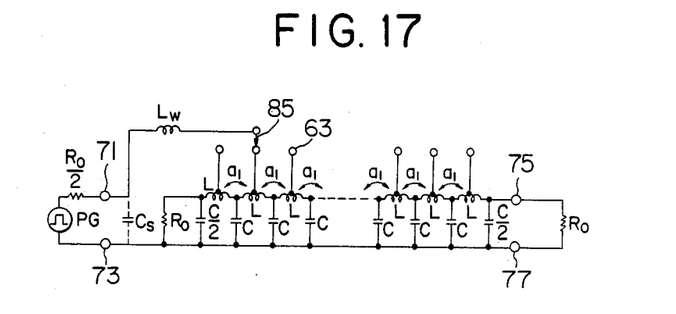
FIG. 17 represents the equivalent circuit diagram of the delay line shown in FIG. 15.

Next the operation of the delay line shown in the present embodiment of this invention will be disclosed with reference to the equivalent circuit diagram shown in FIG. 17. The equivalent circuit diagram also includes the external circuit.

The inductance of one turn of the inductance element 41 of FIG. 14 corresponds to the inductance L of one section of the delay line; the capacitance C of the capacitor 57 is connected between the ground and the contact point of each inductance L, that is, the folded-back connecting portion 47 shown in FIG. 14, and in this manner a ladder type network is formed. Each inductance L is mainly coupled to the adjacent section through the coupling coefficient $a_1$ to a derived m-type delay line.

The delay time td of one section of this delay line is given by, $$td = \sqrt{L(1+2a_1) \cdot C}$$

and the characteristic impedance Ro is given by, $$Ro = \sqrt{L(1+2a_1)/C}$$

Therefore, both the left and right ends of the inductance element 41 are grounded through the load resistor (internal resistance) Ro.

The pulse signal generator PG of internal impedance Ro/2 to be connected to the input side terminals 71 and 73 is connected to one selected fixed contact 63 through connecting inductor Lw depending on the input terminal 71, the electrode 79, slide body 83, and slider 85. In FIG. 17, the symbol Cs indicates the stray capacitance and the conditions for matching of the network are Cs=C and Lw=L/4. However, a slight mismatch does not have any effect on the output signal.

The signal input to the fixed contact 63 from the pulse signal generator PG is transmitted and divided to the left and right in FIG. 17; the signal transmitted to the right is applied to the load resistor Ro existing between the output side terminals 75 and 77 with a delay time corresponding to the respective number of sections; and the signal transmitted to the left is fed to the internal terminating resistor 89 and gets absorbed there. Therefore, the delay time of the output signal can be changed corresponding to the change in the number of sections between the fixed contact 63 and the output contact 75 by switching the fixed contact 63 by sliding the slider 85.

Moreover, since the pitch P and the short side T of the inductance element 41 are set within the range $0.2 < P/T < 1.9$, an optimum coupling coefficient is assured and the rise time is fast, the same as in the case of the delay line shown in FIG. 7.

In an experiment conducted for a variable delay line of the construction shown in FIGS. 15 and 16 according to the present invention, an inductance element 41 was formed with pitch P=0.4 mm, T=0.5 mm, W=1.5 mm, 40 equal turns and length 16 mm. With the capacitance of each capacitor 57 being C=0.05 pF (total 20 pF) the delay time of one section was td=25 pS, the total variable delay time was 2 nS, the characteristic impedance was Ro=100 ohms, and the rise time of the output pulse signal was approximately 150 pS. By sliding the knob 87, it was possible to change the delay time up to about 2 nS at 50 PS intervals in 40 steps.

In the case of a variable delay line with more variation range, the group characteristic was lower as compared with the fixed delay lines shown in FIG. 7 and FIG. 9, but no problem arises in practice.

An embodiment of this invention was described using the inductance element 41 shown in FIG. 14 in the variable delay line, but the same can also be applied to the delay line as shown in FIG. 7 above. Moreover, the inductance element 41 does not depend on the turns of the wire and is formed into a solenoid shape by alternate bending in the opposite direction at right angles to the plane of the parallel conductor strip 43. The strip 43 is suitable for precise mechanical griding, photo etching, laser beam cutting and other precise machining techniques; it permits high precision of the dimensions and enables sub-miniaturization and at the same time it also permits easy mass production. For this reason, a sub-miniature type delay line of stable characteristics can be achieved. Moreover, since the cross sectional area of the conductor of the inductance element 41 is large and a self-supported hollow construction is possible by deleting the bobbin, the inductance element has a low loss and has a high Q and thus an ultra-fast rise chracteristic can be achieved even in the ultra-high frequency band.

The inductance element 41 of the present invention is not limited to the example of bending a planar strip into a solid rectangular shape, but it is also possible to make the cross sectional shape form a square, a polygon of rhomboic shape, etc. or a circle. The inductance element in such cases is formed by pressing the conductor strip 43, with the folded-back connection material bent in a direction different from the plane.

Furthermore, the narrow side conductor strip of the inductance element 41, which is the folded-back connecting portion 47, was used as the connecting material of the capacitor and the inductor together with the capacitor electrode 51 of the capacitor 57. However, it is also possible to make this portion as a connection part combined with the capacitor electrode 51, and it can also be used as the fixed contact material of the support 69 or the body 59 in the same manner as the folded-back connecting portion 45 and the connection material of the variable contact. Moreover, it becomes possible to provide a coating of good, wear-resistant hard metal only on the fixed contacts, and thus improvements such as the prevention of wear of the fixed contacts, the prolongation of the life of the delay line and improvements in aging, etc. can also be made. Generally nickel, etc. is used for plating of the undercoat, but since it possesses a strong ferromagnetic characteristic and high conductivity, it has a disadvantage in that if it is mainly used at the part which makes up the inductance L, it affects the coupling coefficients between the inductances and at the same time increases the loss. However, it is possible to perform nickel plating only on hte edge of the folded-back connecting portion 45.

As described hereinabove, the delay line of the present invention considerably enhances the delay characteristic of a lumped constant type delay line for which the rise time had reached the limiting value of 1 nS, and realises a very high speed delay characteristic, miniaturised construction and higher packing density.

What is claimed is:

1. A delay line, comprising; an inductance element comprising a conductor formed into a single layer solenoid shape with a plurality of turns and a prescribed pitch, a space being maintained between adjacent turns; capacitors connected between said conductor and ground at predetermined turns of the inductance element; the turns of said conductor forming a shape having a cross-section with a first dimension T and a second dimension W where W≧T, the pitch P of the said inductance element and said first dimension T being set according to the relation $0.2 < P/T < 1.9$.

2. A delay line as claimed in claim 1, wherein a capacitor is connected to each turn of the inductance element.

3. A delay line as claimed in claim 2, wherein the conductor of the inductance element is formed on a nonmagnetic bobbin.

4. A delay line as claimed in claim 2, wherein the inductance element is formed into a air core solenoid shape.

5. A delay line as claimed in claim 2 or claim 3, wherein the inductance element is formed into a loop shape.

6. A delay line as claimed in claim 5, wherein the conductor of the inductance element is formed on a bobbin of toroidal shape.

7. A delay line, comprising; an inductance element formed of a plurality of serially connected conductors disposed at a prescribed pitch by means of folded-back connection material; a plurality of capacitors connected between ground and said conductor at predetermined turns of the inductance element, turns of said conductor forming a shape having a first cross-sectional dimension T and a second cross-sectional dimension W, where $W \geq T$, the pitch P of said inductance element and the first cross-sectional dimension T whereof being set according to the relation $0.2 < P/T < 1.9$.

8. A delay line as claimed in claim 7, wherein a capacitor is connected to each turn of the inductance element.

9. A delay line as claimed in claim 8, wherein the inductance element is formed into an air core solenoid shape.

10. A delay line as claimed in claim 8 or claim 9, wherein the capacitor is connected to the folded-back connecting material of the inductance element.

11. A delay line as claimed in claim 8 of claim 9, wherein the folded-back connecting material of the inductance element comprises a plurality of fixed contacts, and wherein said delay line is provided with a movable contact which slides on the fixed contacts.

12. A method of forming a delay line, comprising; forming a sinuous, planar conductor having a plurality of legs (43) and connecting portions (45), bending each leg at two locations, said bends being in respectively opposite directions with respect to the plane of the conductor, said two locations being alternatingly offset a distance T such that every even-numbered leg is disposed in a first plane and every odd-numbered leg is disposed in a second plane offset by T from said first plane, one turn of said conductor comprising two of said bent legs, and connecting a capacitor to predetermined ones of said turns, wherein a pitch P of said conductor defined as the distance between adjacent legs in the same plane and said distance T are related such that $0.2 < P/T < 1.9$.

* * * * *